US011422446B2

(12) United States Patent
Huang

(10) Patent No.: US 11,422,446 B2
(45) Date of Patent: Aug. 23, 2022

(54) ILLUMINATION SYSTEM AND PROJECTION APPARATUS

(71) Applicant: Young Optics Inc., Hsinchu Science Park OT (TW)

(72) Inventor: Jia-Bin Huang, Hsinchu Science Park (TW)

(73) Assignee: YOUNG OPTICS INC., Hsinchu (TW)

( * ) Notice: Subject to any disclaimer, the term of this patent is extended or adjusted under 35 U.S.C. 154(b) by 0 days.

(21) Appl. No.: 16/868,039

(22) Filed: May 6, 2020

(65) Prior Publication Data
US 2020/0285136 A1 Sep. 10, 2020

Related U.S. Application Data

(63) Continuation of application No. 16/515,524, filed on Jul. 18, 2019, now abandoned, which is a (Continued)

(30) Foreign Application Priority Data

Mar. 31, 2017 (TW) .................................. 106111237

(51) Int. Cl.
G03B 21/16 (2006.01)
G02B 27/14 (2006.01)
H05K 1/02 (2006.01)
G03B 21/20 (2006.01)
G03B 33/12 (2006.01)
G03B 33/08 (2006.01)
H04N 9/31 (2006.01)
H05K 1/18 (2006.01)
H01L 35/30 (2006.01)

(52) U.S. Cl.
CPC ............. *G03B 21/16* (2013.01); *G02B 27/14* (2013.01); *G02B 27/149* (2013.01); *G03B 21/2013* (2013.01); *G03B 21/2033* (2013.01); *G03B 21/2066* (2013.01); *G03B 33/08* (2013.01); *G03B 33/12* (2013.01); *H04N 9/3111* (2013.01); *H04N 9/3144* (2013.01); *H04N 9/3164* (2013.01); *H05K 1/0203* (2013.01); *H01L 35/30* (2013.01); *H05K 1/181* (2013.01); *H05K 2201/10106* (2013.01); *H05K 2201/10121* (2013.01); *H05K 2201/10174* (2013.01)

(58) Field of Classification Search
CPC ............. G03B 21/16; G03B 21/02–33; G03B 21/2066; G03B 33/08; G03B 33/12; G02B 27/14; G02B 27/149
USPC .......................................................... 353/52
See application file for complete search history.

(56) References Cited

U.S. PATENT DOCUMENTS

2005/0018141 A1   1/2005 Hosaka
2005/0128441 A1*  6/2005 Morgan ............. G03B 21/2033
                                                      353/31
(Continued)

Primary Examiner — Jerry L Brooks
(74) Attorney, Agent, or Firm — Muncy, Geissler, Olds & Lowe, P.C.

(57) ABSTRACT

An illumination system includes a green light source, a red light source, a blue light source, and a thermoelectric cooler. The green light source includes multiple semi-conductor dies, and each of the semi-conductor dies has a power consumption of 8 W or larger. The thermoelectric cooler is thermally coupled to the red light source, and neither the green light source nor the blue light source is thermally coupled to a thermoelectric cooler.

13 Claims, 6 Drawing Sheets

Related U.S. Application Data continuation of application No. 15/928,146, filed on Mar. 22, 2018, now abandoned.

(56) References Cited

U.S. PATENT DOCUMENTS

| | | |
|---|---|---|
| 2005/0135095 A1 | 6/2005 | Geissler |
| 2005/0237619 A1* | 10/2005 | Peterson ................. G02B 5/04 348/E9.027 |
| 2007/0070296 A1* | 3/2007 | Iwanaga ............. H04N 9/3182 353/31 |
| 2007/0127237 A1* | 6/2007 | Shimaoka ............ G09G 3/3413 362/231 |
| 2010/0171935 A1* | 7/2010 | Yamagishi ............. G03B 21/16 315/114 |
| 2014/0313490 A1 | 10/2014 | Miyamoyo et al. |
| 2015/0268544 A1* | 9/2015 | Narikawa ............. H05B 47/10 353/85 |
| 2017/0048501 A1* | 2/2017 | Li .......................... G03B 21/00 |
| 2017/0059973 A1* | 3/2017 | Yamaguchi ........ G03B 21/2033 |

* cited by examiner

ILLUMINATION SYSTEM AND PROJECTION APPARATUS

CROSS-REFERENCE TO RELATED APPLICATIONS

This application is a continuation application of application Ser. No. 16/515,524 filed Jul. 18, 2019, which is a continuation application of application Ser. No. 15/928,146 filed Mar. 22, 2018 for which priority is claimed under 35 U.S.C. § 120; and this application claims priority of Applications No. 106111237 filed in Taiwan on Mar. 31, 2017 under 35 U.S.C. § 119; the entire contents of all of which are hereby incorporated by reference.

FIELD OF THE INVENTION

The present invention relates to an illumination system and a projection apparatus, and more particularly to an illumination system and a projection apparatus provided with an enhanced heat dissipation structure.

BACKGROUND OF THE INVENTION

As the light emitting diode source become popular, more projection apparatuses utilize light emitting diode (LED) as the light sources thereof. To satisfy the requirement of high luminous intensity, high-powered light emitting diodes are used as the light source. However, the high-powered light emitting diodes generate more heat, and the heat reduces lighting efficiency of the light emitting diode source. Therefore, in the conventional projection apparatuses, heat dissipation fins are often mounted to the light emitting diodes to improve heat dissipation efficiency. However, even if the heat dissipation fins are mounted to the light emitting diodes, heat resistance between the light emitting diode and air is not eliminated completely, which results in limited heat dissipation ability.

SUMMARY OF THE INVENTION

The present invention provides an illumination system including a thermoelectric cooler (TEC) mounted between a light source and a heat dissipation element to eliminate heat resistance between light emitting diodes and atmosphere so as to increase heat dissipation efficiency.

For example, the illumination system of the present invention includes a first light source, a second light source, a third light source, and a thermoelectric cooler. The first light source is capable of outputting a first light beam, and the spectrum of the first light beam has a wavelength peak value within a range of 490 nm to 580 nm. The second light source is capable of outputting a second light beam, and the spectrum of the second light beam has a wavelength peak value within a range of 600 nm to 760 nm. The third light source is capable of outputting a third light beam, and the spectrum of the third light beam has a wavelength peak value within a range of 400 nm to 480 nm. The thermoelectric cooler is thermally coupled to the second light source.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

These embodiments refer to use "first", "second", etc. following with noun or element. Such terms should be understood as a nomenclature and should not be construed as giving the limitation on the number of the elements modified by such nomenclature unless a specific number has been given. Optical elements of the invention refer to an element partially or totally made of reflective or transparent material which usually includes glass or plastic. Light beam combination of the invention refers to a combination of more than one light beam into one light beam. "Element A thermally coupled to element B" of the invention refers to the element A and the element B has thermal conductive relation. For example, if the heat of the element A is transferred to element B via a thermal material layer such as thermal grease, then the element A and the element B are thermally coupled.

Figure 1:
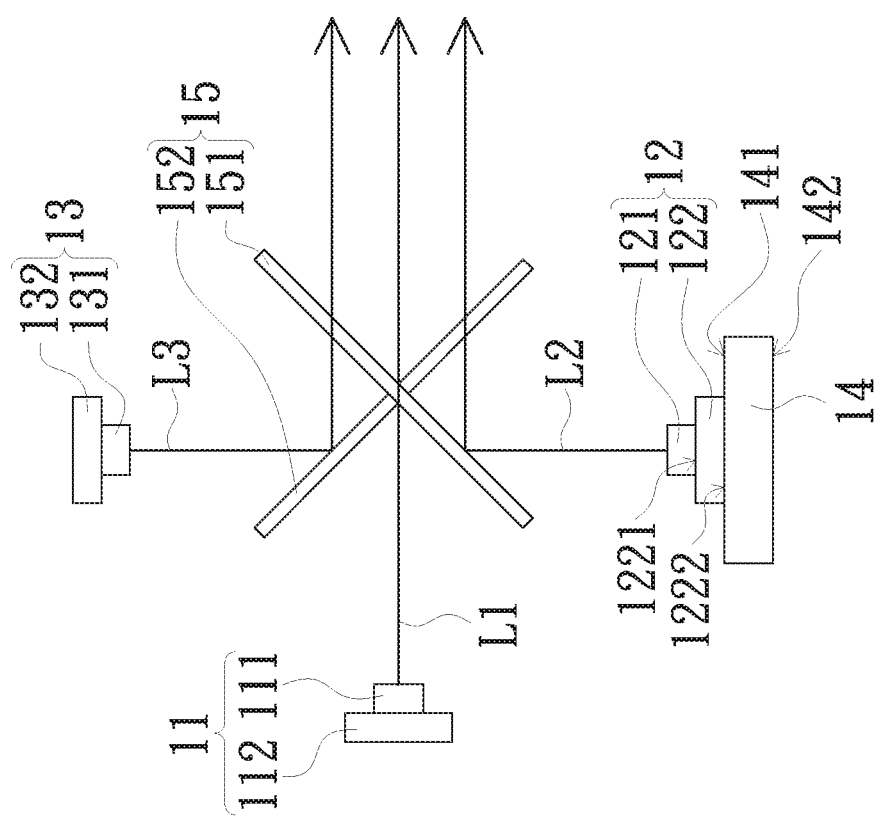
FIG. 1 is a schematic diagram of an embodiment of an illumination system of the present invention.

FIG. 1 is a schematic diagram of an embodiment of an illumination system of the present invention. Referring to FIG. 1, the illumination system 1 includes a first light source 11, a second light source 12, a third light source 13 and a thermoelectric cooler (TEC) 14. The elements of the illumination system 1 of this embodiment are described as follows.

The light source of the invention refers to a light emitting diode, a laser diode or any other element, module or device capable of emitting light beam. However, the light source of the invention is not limited to semi-conductor light sources. In this embodiment, each of the light sources of the invention is an encapsulated LED module. The first light source 11 includes at least one light emitting element 111 and a circuit board 112. The light emitting element 111 is an LED die. The amount of the light emitting element 111 in the first light source 11 is one or more than one. In this embodiment, the amount of the light emitting element 111 is six, and each light emitting element 111 consumes 8 W of power. The light emitting element 111 is disposed above the circuit board 112 and protected by encapsulation resin such as silicone resin. In this embodiment, the first light source 11 is capable of outputting a first light beam L1. The spectrum of the first light beam L1 has a wavelength peak value within a range of 490 nm to 580 nm. That is the first light source 11 emits a green light beam. The light emitting element 111 of the first light source 11 emits the first light beam L1 directly or in another way. For example, phosphor may be mixed into the encapsulation resin to absorb light beam of shorter wavelengths (such as blue light beam) emitted by the first emitting element 111 so as to output the first light beam L1 by excitation. That is the wavelength of the light beam emitted from the light emitting element 111 is not necessarily the same as the light beam emitted by the first light source 11. By the way, the optical filter can be adapted to filter the light emitted by excitation of the phosphor as the first light beam L1. That is the wavelength of the light beam emitted from the light emitting element 111 is not necessarily the same as the light beam emitted from the second light source 11. The optical filter of the invention refers to a bandpass filter, a bandstop filter, a DM filter, a dichroic mirror, a DM prism, an X plate, an X prism, a polarizer beam splitter, a color wheel, a fluorescent wheel, a transflective sheet, a reflective mirror, a lens, a flat glass, any other element capable of filtering light beam, or at least one of the said elements or the combination of the said elements.

It is noted that the spectrum refers to a pattern formed by splitting a multi-color light beam with a color splitting system, such as a grating or a prism, and the pattern is formed by a plurality of color light beams arranged sequentially according to the wavelengths (or frequencies) thereof. The only portion in the said spectrum of electromagnetic wave that is visible to human eye is called visible light beam spectrum. The light in the visible light beam spectrum is called visible light. The wavelength peak value corresponds to the highest intensity value in the visible light.

The second light source 12 includes a light emitting element 121 and a circuit board 122. The light emitting element 121 is an LED die. The amount of the light emitting element 121 is one or more than one. In this embodiment, the amount of the light emitting element 121 is one. The light emitting element 121 is disposed above the circuit board 122 and protected by encapsulation resin such as silicone resin. In this embodiment, the second light source 12 is capable of outputting a second light beam L2. The spectrum of the second light beam L2 has a wavelength peak value within a range of 600 nm to 760 nm. That is the second light source 12 emits red light beam. The light emitting element 121 of the second light source 12 emits the second light beam L2 directly or in another way. For example, phosphor may be mixed into the encapsulation resin to absorb light beam of shorter wavelengths emitted from the light emitting diode 121 (such as blue light beam) light beam so as to output the second light beam L2 by excitation. By the way, the optical filter can be adapted to filter the light emitted by excitation of the phosphor as the first light beam L2. That is the wavelength of the light beam emitted from the light emitting element 121 is not necessarily the same as the light beam emitted from the second light source 12.

The third light source 13 includes a light emitting element 131 and a circuit board 132. The light emitting element 131 is an LED die. The amount of the light emitting element 131 is one or more than one. In this embodiment, the amount of the light emitting element 131 is one. The light emitting element 131 is disposed above the circuit board 132 and protected by encapsulation plastic such as silicone resin. In this embodiment, the third light source 13 is capable of outputting a third light beam L3. The spectrum of the third light beam L3 has a wavelength peak value within a range of 400 nm to 480 nm. That is the third light source 13 emits blue light beam. The light emitting element 131 of the third light source 13 emits the third light beam L3 directly or in another way. For example, phosphor may be mixed into the encapsulation resin to absorb light beam of shorter wavelengths emitted from the light emitting element 131 (such as blue light beam) light beam so as to output the third light beam L3 by excitation. By the way, the optical filter can be adapted to filter light emitted by excitation of the phosphor as the first light beam L3. That is the wavelength of the light beam emitted from the light emitting element 131 is not necessarily the same as the light beam emitted from the third light source 13.

Figure 2:
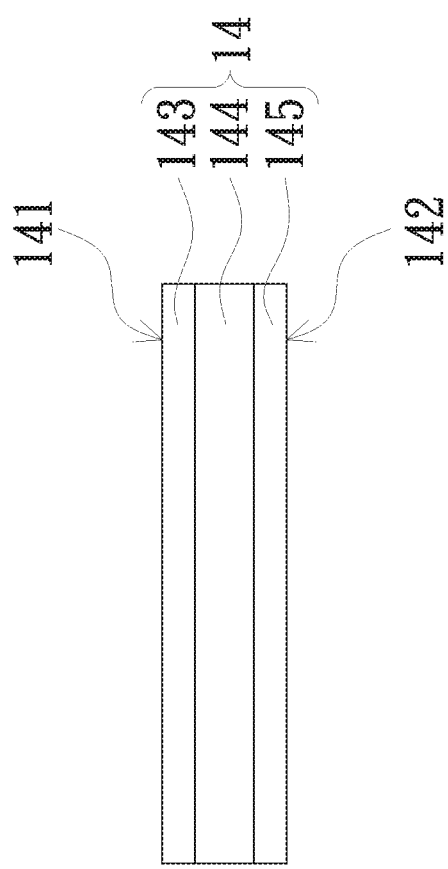
FIG. 2 is a schematic diagram of a thermoelectric cooler of FIG. 1.

The thermoelectric cooler (TEC) 14 of the present invention refers to a semiconductor element which has temperature difference generated between two opposite sides thereof when current (preferable direct current) flows through it. The temperature difference is affected by the magnitude of current. The greater temperature difference is induced by a larger current. The thermoelectric cooler 14 has a cold side 141 and a hot side 142. When the current flows through the thermoelectric cooler 14, the temperature difference is induced between the cold side 141 and the hot side 142. The cold side 141 can provide cooling functions. Referring to FIG. 2, in this embodiment, the thermoelectric cooler 14 serves as a heat dissipation element. The thermoelectric cooler 14 includes a first conductive material layer 143, a semi-conductor material layer 144 and a second conductive material layer 145. The semi-conductor material layer 144 is disposed between the first conductive material layer 143 and the second conductive material layer 145. The first conductive material layer 143 is thermally coupled to the second light source 12 as to transfer heat generated by the second light source 12 from the first conductive material layer 143 to the second conductive material layer 145. In this embodiment, the first conductive material layer 143 and the second conductive material layer 145 are ceramic plates respectively.

The first conductive material layer 143 and the second conductive material layer 145 are suitable for conducting heat. The semi-conductor material layer 144 includes one or more pairs of serially connected P-type semiconductor material and N-type semiconductor material. When a current flows through the semi-conductor material layer 144, those carriers (by electron holes and electrons mechanism) in the P-type semiconductor material and the N-type semiconductor material move away from the first conductive material layer 143 to reduce the temperature of the first conductive material layer 143, and thus the upper surface of the first conductive material layer 143 becomes the cold side 141. The carriers also move towards the second conductive material layer 145 to increase the temperature of the second conductive material layer 145 connected to the semi-conductor material layer 144, and thus the lower surface of the second conductive material layer 145 becomes the hot side 142.

In addition, the illumination system 1 further includes a light combining optical element 15. A portion or whole of the light combining optical element 15 is made of transparent and reflective material such as glass or plastic. The light combining optical element 15 combines more than one light beams to become one light beam. Referring to FIG. 1, in this embodiment, the light combining optical element 15 includes a first light beam splitter 151 and a second light beam splitter 152. The first light beam splitter 151 and the second light beam splitter 152 are mutually crossly arranged to form an X-shape structure. The first light beam splitter 151 and the second light beam splitter 152 are used to split light beam having different wavelengths. The first splitter 151 is capable of reflecting the second light beam L2 and allowing the first light beam L1 and the third light beam L3 to pass. The second splitter 152 is configured to reflect the third light beam L3 and allow the first light beam L1 and the second light beam L2 to pass. In another embodiment, the light combining optical element can include two parallel light beam splitters. More specifically, one splitter has one side slantly facing the first light source 11 and the other side slantly facing the second light source 12. The other splitter has one side parallel facing the previously mentioned splitter and the other side slantly facing the third light source 13 and a light beam emergent plane so as to combine the light beams.

After each element is described, an embodiment is introduced to describe the relations of the elements. Referring to FIG. 1, the light combining optical element 15 is disposed between the first light source 11, the second light source 12 and the light source 13. The thermoelectric cooler 14 is thermally coupled to the second light source 12. More specifically, the circuit board 122 of the second light source 12 has a first side 1221 and a second side 1222 opposite to the first side 1221. The light emitting element 121 is disposed on the first side 1221, and the second side 1222 is connected to the cold side 141 of the thermoelectric cooler 14. In addition, a thermal interface material layer (not illustrated), such as thermally conductive pads, thermally conductive grease, thermally conductive gel or thermally conductive tape, is disposed between the thermoelectric cooler 14 and the second light source 12.

As the relative relation of said elements, optical paths of the light beam from the first light source 11, the second light source 12 and the light source 13 are described as follows. The light combining optical element 15 enables the first light beam L1, the second light beam L2 and the third light beam L3 to propagate along a substantially identical path and then combines the first light beam L1, the second light beam L2 and the third light beam L3. More specifically, the first light beam L1 output by the first light source 11 passes through the first light beam splitter 151 and the second light beam splitter 152. The second light beam L2 output by the second light source 12 is reflected by the first light beam splitter 151 so as to propagate along the substantially identical optical path along which the first light beam L1 passes through the light combining optical element 15. The third light beam L3 output by the third light source 13 is reflected by the second light beam splitter 152 so as to propagate along the substantially identical optical path along which the first light beam L1 passes through the light combining optical element 15.

The thermoelectric cooler 14 of the illumination system 1 is disposed on the second side 1222 of the second light source 12 to dissipate heat generated by the second light source 12. The thermoelectric cooler 14 can reduce the heat resistance between the second light source 12 and environmental air. More specifically, the heat resistance between the second light source 12 and air can be reduced to a degree of approximately 0° C./W. The second side 1222 of the second light source 12 has a temperature close or even lower than the environment temperature so as to promote heat dissipation efficiency of the second light source 12. It can improve reduction issues on lighting efficiency of the second light source 12 due to accumulated heat. The luminous intensity of the illumination system 1 is ensured thereby.

Figure 3:
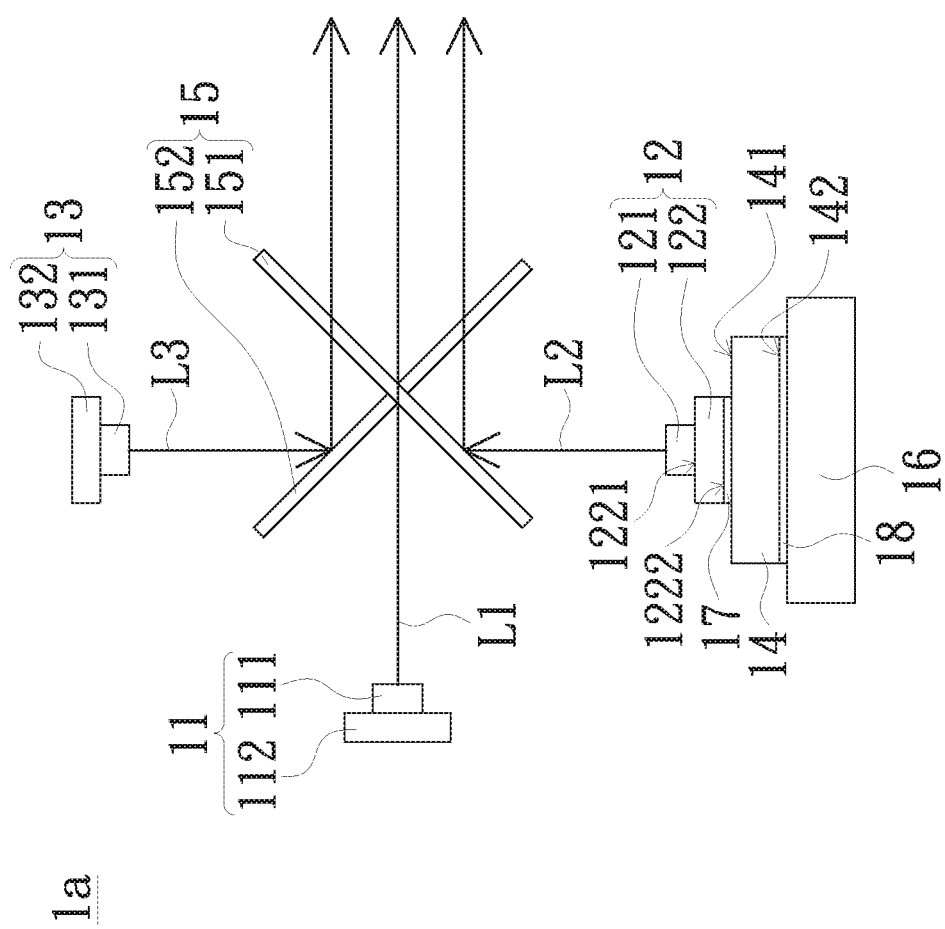
FIG. 3 is a schematic diagram of another embodiment of an illumination system of the present invention.

FIG. 3 is a schematic diagram of another embodiment of an illumination system of the present invention. Referring to FIG. 3, an illumination system 1a is similar to the illumination system 1 of FIG. 1. The main difference between them is that the illumination system 1a further includes a heat dissipation device 16 thermally coupled to the hot side 142 of the thermoelectric cooler 14. More specifically, the heat dissipation device 16 can be fin type (heat fin set), heat pipe type, vapor chamber type or coolant loop type, and it is mounted to the hot side 142 of the thermoelectric cooler 14 to promote heat dissipation efficiency.

In addition, the illumination system 1a further includes a first thermal interface material layer 17 and a second thermal interface material layer 18. For example, the first thermal interface material layer 17 and the second thermal interface material layer 18 are thermal grease, thermal conductive adhesive or thermal conductive tape, which has good heat conductive properties. In this embodiment, the first thermal interface material layer 17 is disposed between the cold side 141 of the thermoelectric cooler 14 and the second side 1222 of the circuit board 122, and connected to the cold side 141 and the second side 1222. The second thermal interface material layer 18 is disposed between the hot side 142 of the thermoelectric cooler 14 and the heat dissipation device 16, and connected to the hot side 142 and the heat dissipation device 16. Thus, the heat generated by the circuit board 122 is easily conducted to the cold side 141 of the thermoelectric cooler 14, and the heat from the hot side 142 of the thermoelectric cooler 14 is easily conducted to the heat dissipation device 16.

Figure 4:
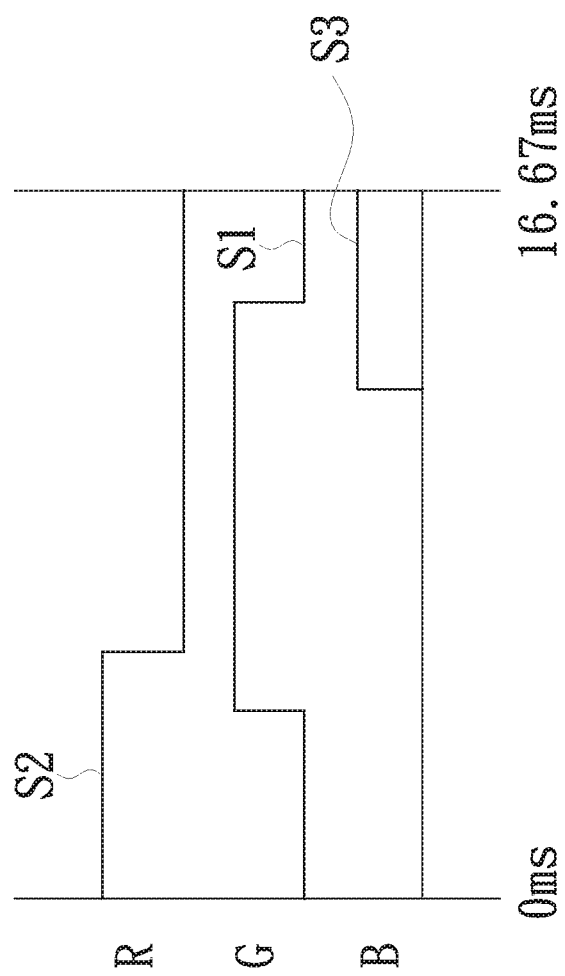
FIG. 4 is a schematic diagram of control signals for an embodiment of a first light source, a second light source and a third light source of the present invention.

In this embodiment, the illumination system 1a is suitable for a projection apparatus. The projection apparatus is capable of converting illuminating light beam into image light beams so as to project the image thereof. The images include a plurality of frames generated in time sequence. By adjusting the percentage of each of the said light beams of different color in a time period of one single frame, the luminous intensity of output light beam of the illumination system 1a can thereby be increased. FIG. 4 is a schematic diagram of controlling signals for an embodiment of a first light source, a second light source and a third light source of the present invention. Referring to FIG. 4, when the duty of first light beam L1 reaches 45%, or say, emitted for a time length, within the specified time period, for at least 45% of the specified time period, the luminous intensity of emergent light beam of the illumination system 1a is already raised. In another embodiment, the time ratio described above can be understood as the percentage of the amount of time that each light beam received by light valve in each second. It is preferable that the first light beam L1 is emitted, for a time length of at least 50% of the specified time period within the time of specified time period. And it is the best that the first light beam L1 is emitted, for a time length of at least 60% of the specified time period within the time of specified time period. In this embodiment, the time length for playing a single frame is 16.6 ms. The first light beam L1 is emitted, within the specified time period, for a time length of at least 65.3% of the specified time period (as shown by the control signal S1), the second light beam L2 is emitted for a time length, within the specified time period, being 33.95% of the specified time period (as shown by the control signal S2), and the third light beam L3 is emitted for a time length, within the specified time period, being 32.55% of the specified time period (as shown by the control signal S3). When the sum of the time period percentage of each light beam is more than 100%, it means that more than one light source are turned on simultaneously in the specified time period of playing a single frame.

Figure 5:
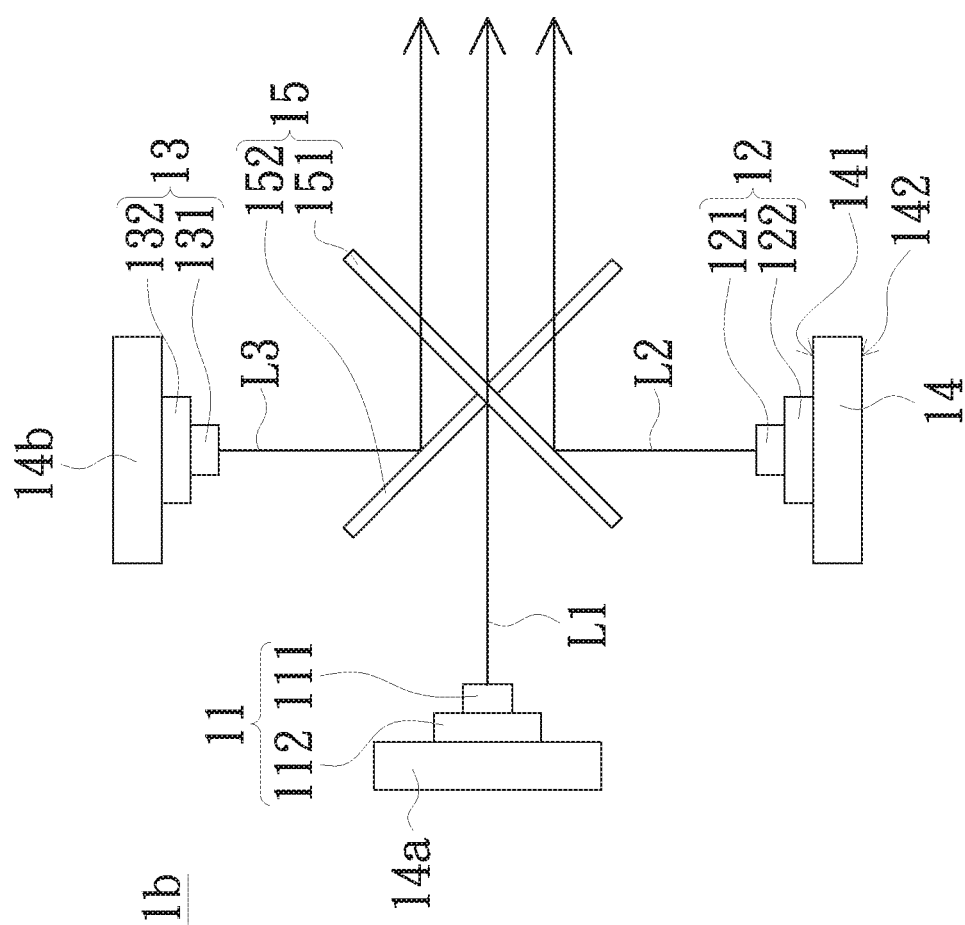
FIG. 5 is a schematic diagram of another embodiment of an illumination system of the present invention.

FIG. 5 is a schematic diagram of another embodiment of an illumination system of the present invention. Referring to FIG. 5, an illumination system 1b is similar to the illumination system 1 of FIG. 1. The main difference between them is that the illumination system 1b further includes other thermoelectric coolers 14a and 14b. The thermoelectric coolers 14a and 14b are disposed in the first light source 11 and the third light source 13 to promote the heat dissipation efficiency thereof.

On the other hand, the heat dissipation device 16, the first thermal interface material layer 17 and the second thermal interface material layer 18 of FIG. 3 can also be applied in the illumination system 1b. In another embodiment, only one or two of the first light source 11, the second light source 12 and the third light source 13 is/are thermally coupled to the thermoelectric coolers according to system requirement.

In the embodiment of FIG. 3, each of the first light source 11, the second light source 12 and the third light source 13 is equipped with a thermoelectric cooler 14 to improve heat dissipation efficiency. As shown in the table 1, the temperature of each light source in the illumination system 1b and the temperature of each light source in a conventional system are measured under the same condition and shown in the table 1. The illumination system 1b reduces the temperature of each light source more than the conventional illumination system does (each light source is equipped with heat dissipation device but no thermoelectric coolers are disposed between the light source and the thermoelectric coolers). The illumination system 1b of the present invention can reduce the temperature of the first light source 11, the second light source 12 and the third light source 13 more than the conventional illumination system.

TABLE 1

|  | First light source | Second light source | Third light source | Environment temperature |
|---|---|---|---|---|
| Conventional illumination system | 44.7° C. | 34.5° C. | 46.9° C. | 25° C. |
| Illumination system 1b | 35.5° C. | 17.9° C. | 39.5° C. | 25° C. |

Figure 6:
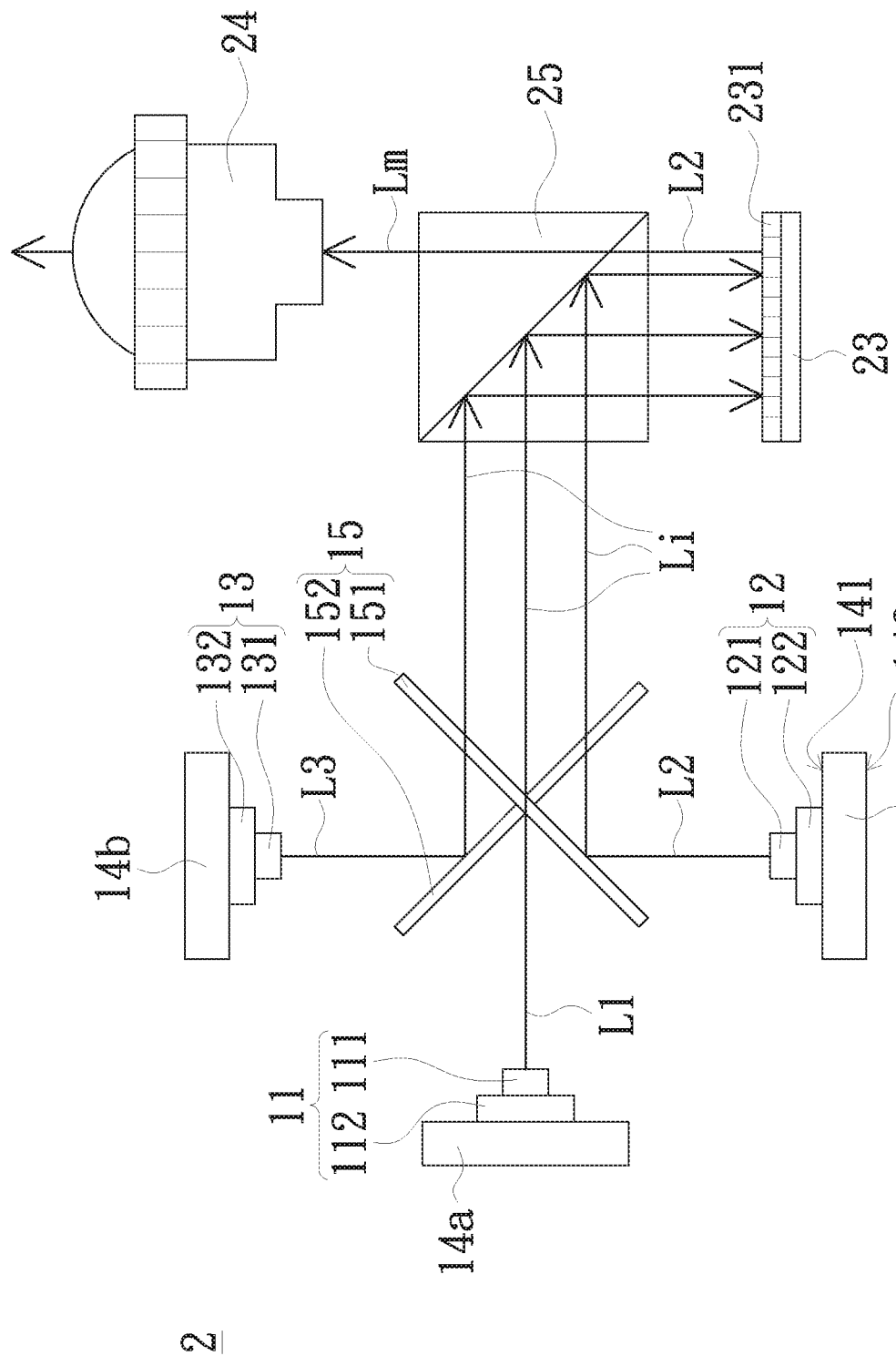
FIG. 6 is a schematic diagram of an embodiment of a projection apparatus of the present invention.

FIG. 6 is a schematic diagram of an embodiment of a projection apparatus of the present invention. Referring to FIG. 6, the projection apparatus 2 of the present invention includes a first light source, a thermoelectric cooler, a light valve 23 and a projection lens 24.

The light source is configured to emit illuminating light beam Li. The light source in this embodiment is an element, a module or a device capable of emitting light beams in different colors. Furthermore, the light source includes the first light source 11, the second light source 12 and the third light source 13 which are configured to provide red light beam, green light beam and blue light beam sequentially or provide white light beam (the red light beam, the green light beam, and the blue light beam emit simultaneously). In another embodiment, the light source can also be an element, a module or a device capable of emitting white light beam. More specifically, the light source may be a mercury lamp, a white LED light source or a white LD light source. The illuminating light beam Li can be splitted into red light beam, green light beam and blue light beam according to a time sequence by a color wheel or other color splitting element. The emitting sequence of red light beam, green light beam, blue light beam and white light beam is also adjustable according to requirement.

The thermoelectric coolers are thermally coupled to the light source for cooling the light source. The amount of the thermoelectric cooler can be one or more than one. The thermoelectric coolers are connected to the corresponding light sources. More specifically, the amount of the thermoelectric cooler in this embodiment is three (the thermoelectric coolers 14, 14a and 14b). The thermoelectric coolers 14, 14a and 14b are connected to the first light source 11, the second light source 12 and the third light source 13 respectively to increase heat dissipation efficiency of each light source. In addition, the thermoelectric coolers can also be disposed in the first light source 11 only as the illumination systems 1 and 1a, or the thermoelectric coolers are disposed in one or more than two of the first light source 11, the second light source 12 and the third light source 13.

The light valve 23 is a device capable of converting illuminating light beam to image light beam. More specifically, the light valve is reflective light valve such as digital micro-mirror device (DMD) or liquid crystal on silicon panel (LCOS Panel) or transmissive light valve such as liquid crystal display panel (LCD). In this embodiment, the light valve is a digital micro-mirror device including a plurality of light beam processing structures 231. Each of the light beam processing structures 231 corresponds to a pixel. The light beam processing structure 231 is a reflective mirror.

In addition, the projection apparatus 2 of this embodiment further includes a total internal reflection prism (TIR prism) 25 configured to reflect the illuminating light beam Li to the light valve 23. Although the projection apparatus 2 of FIG. 6 utilizes the total internal reflection prism 25, the invention is not limited thereto. In another embodiment, the total internal reflection prism 25 can be replaced by a reverse total internal reflection prism (RTIR prism) or a field lens. In addition, the projection apparatus may utilize transmissive light valve, and the amount of the light valve can be more than one (for example three), and the invention is not limited thereto.

In this embodiment, the light source is configured to emit illuminating light beam Li, and the light valve 23 is configured to convert the illuminating light beam Li to image light beam Lm. The projection lens is configured to project the image light beam Lm to form images on a screen.

Since the projection apparatus 2 of this embodiment includes thermoelectric coolers, heat dissipation efficiency is promoted and the quality and brightness of images of the projection apparatus 2 are thus approved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A projection apparatus, comprising:
  a green light source having a power consumption of no less than 48 W and comprising multiple semi-conductor dies;
  a red light source;
  a blue light source;
  a thermoelectric cooler thermally coupled to the red light source, and neither the green light source nor the blue light source being thermally coupled to a thermoelectric cooler, wherein the thermoelectric cooler is capable of only absorbing heat from the red light source;
  a light valve disposed downstream of the red light source, the blue light source and the green light source;
  a projection lens disposed downstream of the light valve; and
  a prism disposed at a light path between the light valve and the projection lens.

2. The projection apparatus according to claim 1, further comprising:

a first splitter and a second splitter, the first splitter being capable of allowing a first color beam to pass and reflecting a second color beam, the second splitter being capable of allowing the first color beam to pass and reflecting a third color beam, and the first color beam, the second color beam and the third color beam being substantially different from one another.

3. The projection apparatus according to claim 2, wherein the first splitter is disposed downstream of the green light source, the red light source and the blue light source.

4. The projection apparatus according to claim 3, wherein the first splitter and the second splitter forms an X-shape structure.

5. The projection apparatus according to claim 3, wherein the first splitter has one side facing the green light source and the blue light source, and the second splitter has one side facing green light source and the red light source.

6. The projection apparatus according to claim 2, wherein the first splitter is disposed downstream of the first light source and the second light source but not downstream of the third light source.

7. The projection apparatus according to claim 6, wherein the first splitter is parallel to the second splitter.

8. The projection apparatus according to claim 6, wherein the first splitter has one side slantly facing the green light source and another side slantly facing the red light source, and the second splitter has one side slantly facing the first splitter and another side slantly facing the blue light source.

9. The projection apparatus according to claim 2, wherein the first color beam is from the green light source, the second color beam is from the red light source, and the third color beam is from the blue light source.

10. The projection apparatus according to claim 9, wherein a specified time period refers to time needed to play a single frame, and, within the specified time period, the first color beam is outputted for a time length of at least 45% of the specified time period.

11. The projection apparatus according to claim 10, wherein the first color beam has a duty of at least 60% or more.

12. The projection apparatus according to claim 1, wherein the projection apparatus comprises no more than one thermoelectric cooler.

13. The projection apparatus according to claim 1, further comprising a heat dissipation device thermally coupled to a heat side of the thermoelectric cooler.

* * * * *